United States Patent
Lai et al.

(10) Patent No.: US 6,596,448 B2
(45) Date of Patent: Jul. 22, 2003

(54) PHASE ERROR MONITOR PATTERN AND APPLICATION

(75) Inventors: Chien-Wen Lai, Taipei Hsien (TW); Chemg-Shyan Tsay, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 120 days.

(21) Appl. No.: 09/885,895

(22) Filed: Jun. 20, 2001

(65) Prior Publication Data

US 2002/0197542 A1 Dec. 26, 2002

(51) Int. Cl.[7] .............................. G03F 7/00; G03F 9/00; G06F 17/50
(52) U.S. Cl. .............................. 430/30; 430/5; 430/322; 430/394; 430/396; 716/19; 716/21; 382/144; 382/151
(58) Field of Search .............................. 430/5, 30, 322, 430/394, 396; 716/19, 21; 382/144, 151

(56) References Cited

U.S. PATENT DOCUMENTS

| | | | | |
|---|---|---|---|---|
| 5,300,786 A | * | 4/1994 | Brunner et al. | 250/548 |
| 5,439,767 A | * | 8/1995 | Yamashita et al. | 430/30 |
| 5,756,235 A | * | 5/1998 | Kim et al. | 430/5 |
| 5,757,507 A | * | 5/1998 | Ausschnitt et al. | 356/401 |
| 6,083,807 A | * | 7/2000 | Hsu | 438/401 |
| 6,338,922 B1 | * | 1/2002 | Liebmann et al. | 430/5 |

* cited by examiner

Primary Examiner—Mark F. Huff
Assistant Examiner—Nicole Barreca
(74) Attorney, Agent, or Firm—J.C. Patents

(57) ABSTRACT

A phase error monitor pattern and its related applications. The phase error monitor pattern includes an alternating phase shift pattern on the peripheries of an alternating phase shift mask and a modification pattern on the peripheries of a modification pattern. The alternating phase shift mask and the modification mask are used in sequence. The alternating phase shift pattern has a plurality of pairs of first non-transparent regions. Each pair of first non-transparent regions is located at each side of a phase shift region. The modification pattern has a plurality of second non-transparent regions. Each second non-transparent region corresponds in position to the non-transparent region on a first side of each pair of first non-transparent regions. The method of monitoring phase errors includes sequentially performing photo-exposure of a positive photoresist using the alternating phase shift mask and the modification mask and measuring the deviations of the monitor photoresist pattern. Finally, phase error of the alternating phase shift mask is deduced according to the measured shift and the defocusing of the exposure light source.

14 Claims, 4 Drawing Sheets

PHASE ERROR MONITOR PATTERN AND APPLICATION

BACKGROUND OF THE INVENTION

1. Field of Invention

The present invention relates to a monitoring device in semiconductor manufacturing. More particularly, the present invention relates to a phase error pattern for monitoring the phase error of an alternating phase shift mask (Alt-PSM).

2. Description of Related Art

Following the rapid increase in level of integration, line width of semiconductor devices is often smaller than the wavelength of light source used in photolithographic process. To obtain better pattern resolution, a phase shift mask is routinely used. The earlier type of phase shift mask includes the alternating phase shift mask generally used for producing a plurality of mutually parallel gate lines.

FIG. 1 is a schematic cross-sectional view of a conventional alternating phase shift mask. As shown in FIG. 1, the alternating phase shift mask 100 includes non-transparent regions 110 covered with chromium material and transparent regions 120 and phase shift regions 130 alternating between the non-transparent regions 110. The phase shift regions 130 are 180° out of phase with the transparent regions 120. Hence, light coming from the photoresist layer (not shown) corresponding in position to the non-transparent regions 110 is canceled resulting in a better exposure contrast.

Although a number of methods are available for producing phase shift regions 130 whose phase differs from the transparent regions 120 by 180°, actual phase difference between the two regions frequently deviates from the desired 180° because deposition and etching are difficult to control. For example, for a positive photoresist, with reference to both FIGS. 1 and 2, if the focal point of the light source deviates (that is, defocused), the photoresist pattern 210 may shift to a position closer to the phase shift region 130. The amount of shifting s for a pair of photoresist patterns 210 flanking the same phase shift region 130 is identical but in opposite direction.

The shifting of photoresist pattern 210 often leads to an error in the final pattern position on a wafer. Thus, deviation of photoresist pattern is preferably measured with precision so that phase errors in the mask can be deduced as a reference for correcting the photomask. Unfortunately, the overlay error analyzers used in existing inline monitoring system are mostly optical and wavelength of the light used in detecting position error in photoresist pattern is much greater than the line width of the photoresist pattern 210. Hence, the analyzer cannot measure the amount of shift s in individual photoresist pattern 210 but can only measure the overall deviation of a group of several photoresist lines 210. Because a pair of photoresist pattern 210 flanking a phase shift region 130 moves an identical distance s in opposite directions, overall shifting of the photoresist patterns 210 is zero. Consequently, an overlay error analyzer cannot be used to measure the amount of shifting in photoresist pattern 210 and deduce the phase error of a mask.

SUMMARY OF THE INVENTION

Accordingly, one object of the present invention is to provide a phase shift error monitor pattern that can be used to monitor the phase errors in an alternating phase shift mask. The phase shift monitor pattern includes an alternating phase shift pattern and a modification pattern. The alternating phase shift pattern is located at the periphery of the alternating phase shift mask. The modification pattern is located at the periphery of a modification mask. The alternating phase shift mask and the modification mask are sequentially used in the same exposure process. The alternating phase shift pattern includes a plurality of first non-transparent regions and a plurality of phase shift regions and transparent regions alternately positioned between the first non-transparent regions. The first non-transparent regions on each side of a phase shift region form a pair. The modification pattern includes a plurality of second non-transparent regions. Each second non-transparent region in the modification pattern corresponds to a pair of first nontransparent regions on a first side. The width of each second non-transparent region is larger than the width of any one of the first non-transparent regions.

This invention provides a method for monitoring the phase error of an alternating phase shift mask. The method makes full use of the phase error monitor pattern of this invention. First, a photo-exposure of a positive photoresist layer is conducted using a light source and an alternating phase shift mask having an alternating phase shift pattern thereon (a portion of the phase shift error monitor pattern). Hence, an unmodified photoresist pattern is formed on the positive photoresist layer. The various photoresist patterns correspond to various first non-transparent regions. In addition, the photoresist patterns can be grouped together into a plurality of pairs with each pair corresponding to a pair of first non-transparent regions. A photo-exposure of the positive photoresist layer is again conducted using a modification mask having a modification pattern thereon (another portion of the phase shift error monitor pattern). Hence, every pair of photoresist patterns on the first side is removed while every pair of photoresist patterns on the second side is retained. Ultimately, a monitor photoresist pattern is formed. Thereafter, an overlay error analyzer is used to measure the amount of deviation in this monitor photoresist pattern. Finally, phase error of the alternating phase shift mask is deduced from the defocusing value of the light source and the measured amount of deviation of the monitor photoresist pattern.

This invention also provides a method of monitoring the positional error of a photoresist pattern through an alternating phase shift mask. The method includes using the alternating phase shift mask to perform a photo-exposure of a photoresist layer. Thereafter, a photo-exposure of the photoresist layer is conducted using a modification mask so that every pair of photoresist patterns on a first side are removed while every pair of photoresist patterns on a second side are retained. Finally, an overlay error analyzer is used to measure the amount of deviation of the photoresist patterns remaining on the second side.

The monitor photoresist pattern produced by the phase error monitor pattern of this invention retains only every pair of photoresist patterns on the same side. Since each one of these retained photoresist patterns shift an identical distance towards one direction, overall amount of shifting for these photoresist patterns (in other words, the amount of shifting in the monitor photoresist pattern) is non-zero. Ultimately, an overlay error analyzer is able to measure the amount of shifting and deduce the phase error in the alternating phase shift mask from the measurement.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
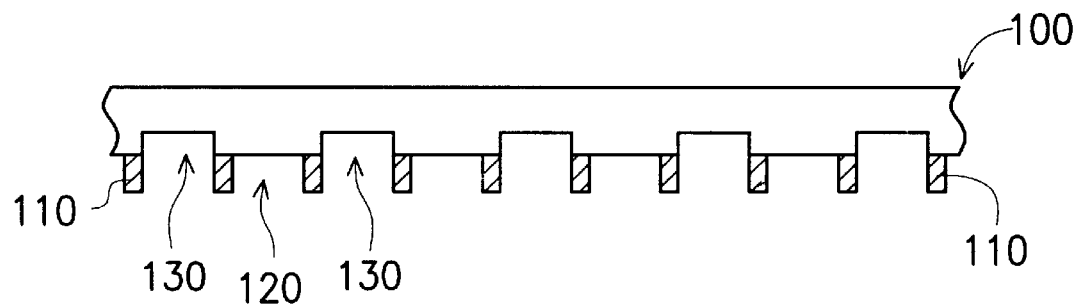
FIG. 1 is a schematic cross-sectional view of a conventional alternating phase shift mask.
Figure 2:
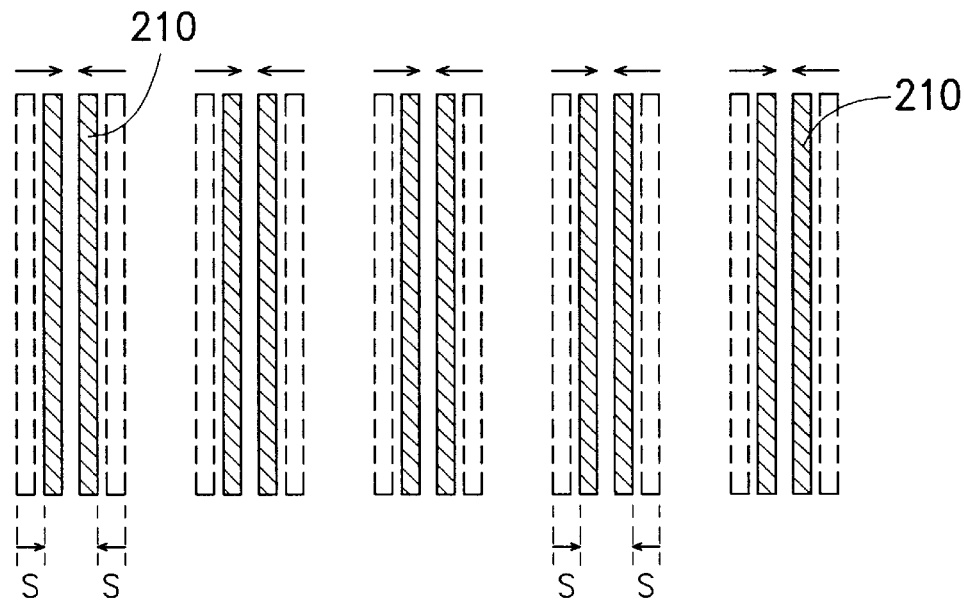
FIG. 2 is schematic diagram showing phase shift error and defocusing on a photoresist layer after photo-exposure using the alternating phase shift mask shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
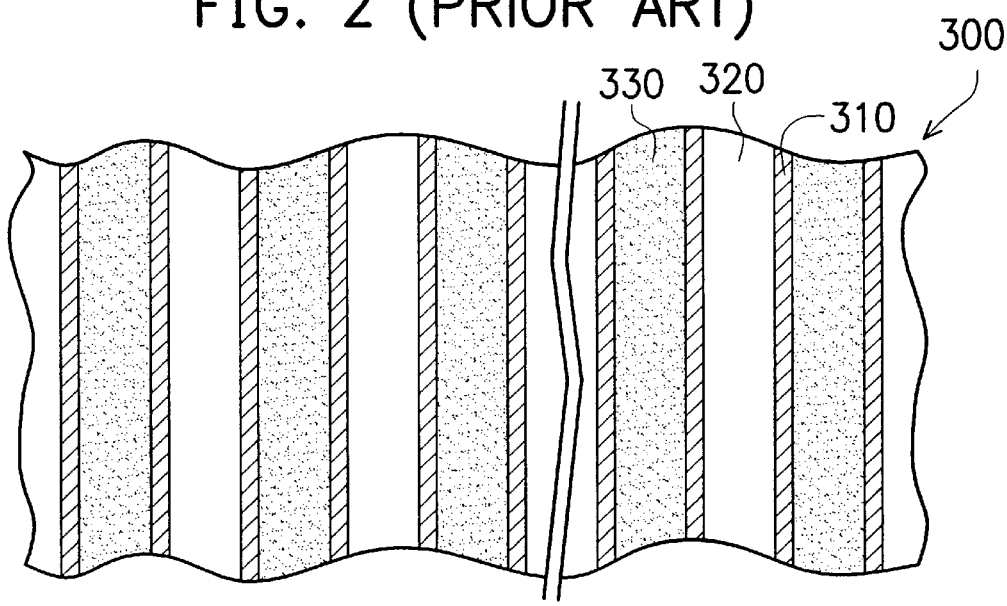
FIG. 3 is a schematic diagram showing the structure of an alternating phase shift mask according to one preferred embodiment of this invention.

FIG. 3 is a schematic diagram showing the structure of an alternating phase shift mask according to one preferred embodiment of this invention. As shown in FIG. 3, the alternating phase shift mask 300 includes non-transparent regions 310 and transparent regions 320 and phase shift regions 330 in alternating positions between the nontransparent regions 310. Phase shift errors between the phase shift region 330 and the transparent region 320 is the target of measurement.

Figure 4:
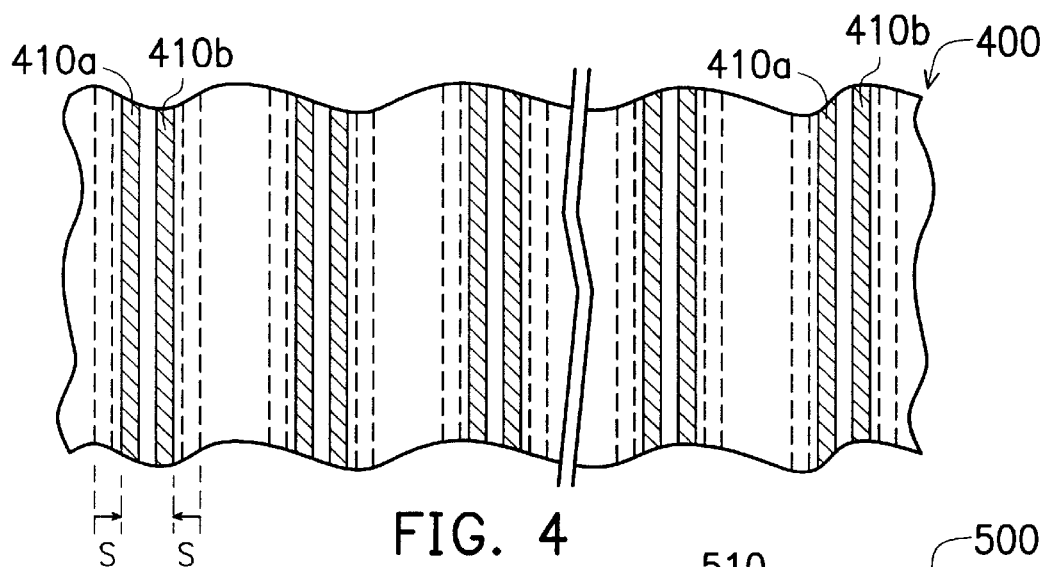
FIG. 4 is a schematic diagram showing phase shift error and defocusing on a photoresist layer after photo-exposure using the alternating phase shift mask shown in FIG. 3.

FIG. 4 is a schematic diagram showing phase shift error and defocusing on a photoresist layer after photo-exposure using the alternating phase shift mask shown in FIG. 3. By exposing a positive photoresist layer through the alternating phase shift mask 300, a photoresist layer having patterns 410a and 410b thereon is obtained. The photoresist patterns 410a and 410b correspond to the non-transparent regions 310 on the alternating phase shift mask 300. However, due to phase shift errors in the alternating phase shift mask 300, a pair of photoresist pattern 410a/410b corresponding to the two sides of the same phase shift region 330 shifts an identical distance s in opposite directions. In FIG. 4, the areas enclosed by dashed lines indicate the correct positions of the photoresist pattern.

Figure 5:
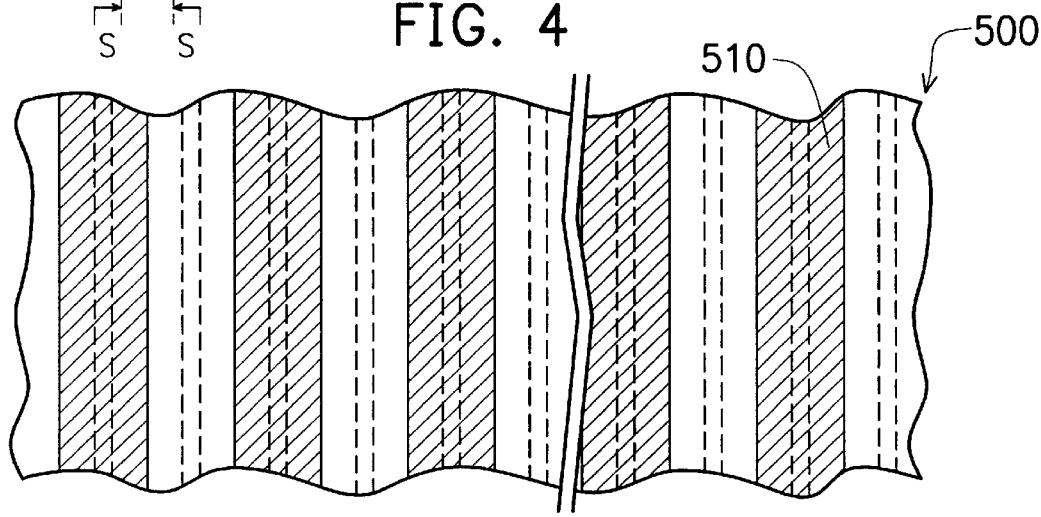
FIG. 5 is a schematic diagram showing the structure of a modification mask (to be used together with the alternating phase shift mask shown in FIG. 3) according to one preferred embodiment of this invention.

FIG. 5 is a schematic diagram showing the structure of a modification mask (to be used together with the alternating phase shift mask shown in FIG. 3) according to one preferred embodiment of this invention. A photo-exposure of the positive photoresist layer 400 is carried out using the modification mask 500 in FIG. 5. The modification mask 500 includes a plurality of non-transparent regions 510. Each non-transparent region 510 covers the photoresist pattern 410a of the pair of photoresist patterns 410a/410b corresponding to the two sides of each phase shift region 330 but exposes the photoresist pattern 410b. Hence, the photoresist patterns 410b on all the right sides of every pair of photoresist patterns 410a/410b are removed. The original profiles are indicated by dotted lines in FIG. 6.

Figure 6:
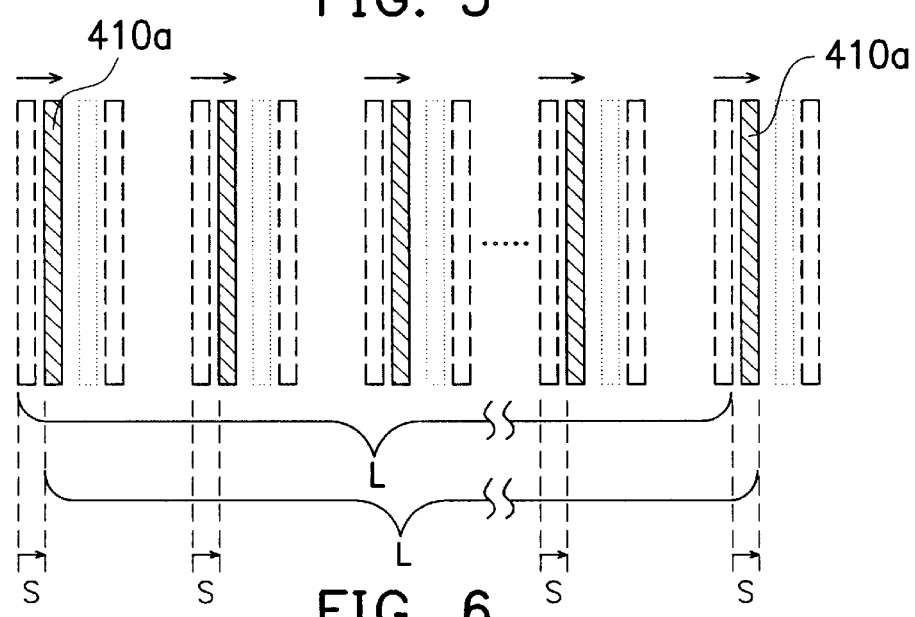
FIG. 6 is a schematic diagram of a developed photoresist layer after using the modification mask in FIG. 5 to expose the photoresist layer shown in FIG. 4.

FIG. 6 is a schematic diagram of a developed photoresist layer after using the modification mask in FIG. 5 to expose the photoresist layer shown in FIG. 4. Since all the photoresist patterns 410a on the left side of every pair of photoresist patterns 410a/410b are retained but with a shift to the right by a distance s, overall shifting of the photoresist patterns 410a is s. The shifted distance s can be accurately measured by an overlay analyzer. In addition, to obtain overlay error of the photoresist pattern 410a accurately with due consideration regarding line pattern density and resolution of overlay error analyzer, total length L of the photoresist patterns 410a may have to be about 5–10 µm.

Figure 7:
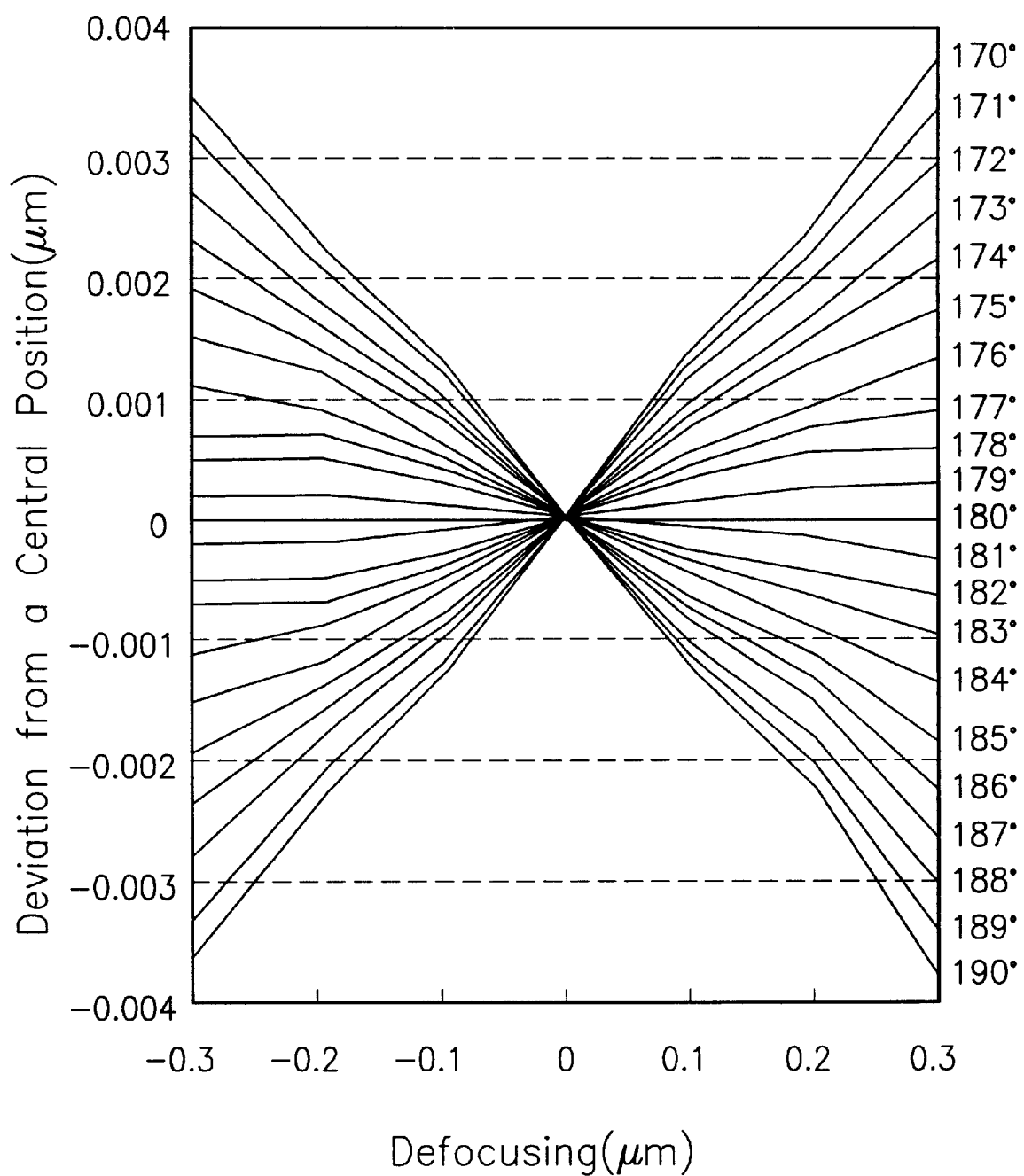
FIG. 7 is a graph showing the relationship between the amount of shifting in photoresist patterns and the level of defocusing.

After obtaining the overlay errors, the next step is to use the overlay errors to deduce phase errors in the alternating phase shift mask. FIG. 7 is a graph showing the relationship, through theoretical calculations or experimental determination, between amount of shifting of photoresist patterns from a central position, value of defocusing of light source and phase errors in the alternating phase shift mask. As shown in FIG. 7, the greater the defocusing, the greater will be the deviation from a central position. Furthermore, the greater the phase errors, the greater will be the slope of the defocusing-central deviation curve. Therefore, to deduce the phase errors, defocusing value may vary accordingly. Through the aforementioned steps, a series of defocusing-central deviation relationships can be obtained. The slope of the defocusing-central deviation curve can be obtained by plotting. By comparing with the graph in FIG. 7, phase errors are deduced.

Figure 8A:
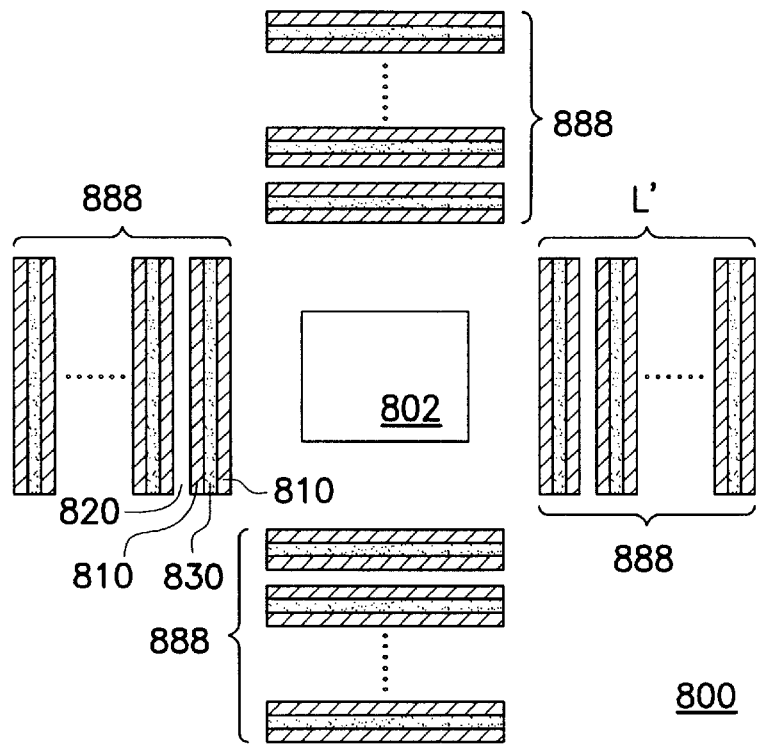
FIG. 8A is a diagram showing an alternating phase shift mask and corresponding alternating phase shift pattern therein (the alternating phase shift pattern is a part of the phase error monitor pattern) according to this invention.
Figure 8B:
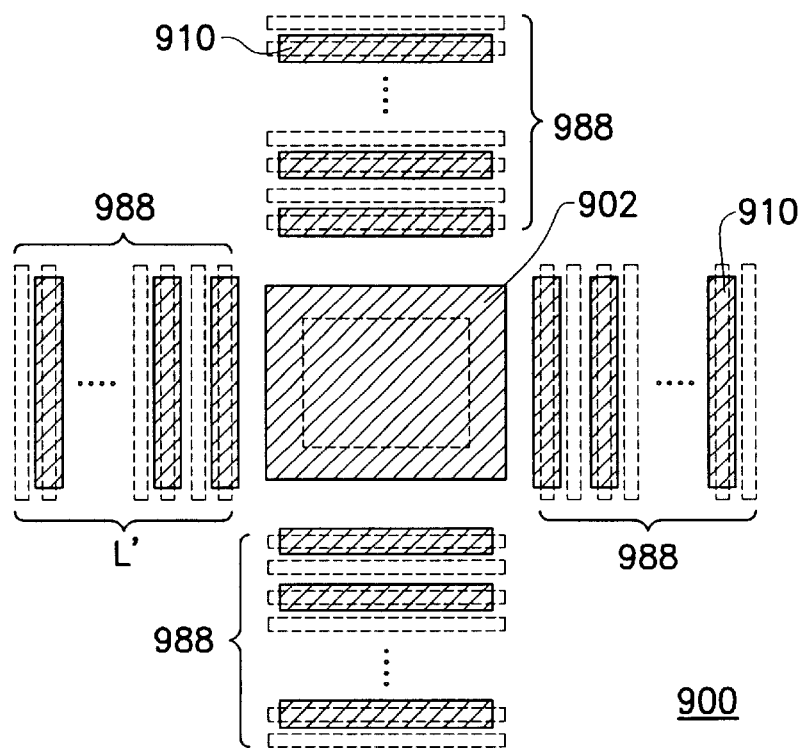
FIG. 8B is a diagram showing a modification mask and corresponding modification pattern therein (the modification pattern is a part of the phase error monitor pattern) according to this invention.

FIG. 8A is a diagram showing an alternating phase shift mask 800 and an associated alternating phase shift pattern 888 therein according to this invention. Similarly, FIG. 8B is a diagram showing a modification mask 900 and an associated modification pattern 988 therein according to this invention. The alternating phase shift pattern 888/modification pattern 988 is a portion of the phase error monitor patterns of this invention. In addition, the alternating phase shift mask 800 and the modification mask 900 are used together in sequence.

Just like most overlay mark designs, the alternating phase shift patterns 888 in FIG. 8A are formed around a device pattern region 802 for eliminating overlay errors. In addition, each alternating phase shift pattern 888 includes a plurality of parallel lines of non-transparent regions 810 as well as a plurality of transparent regions 820 and phase shift regions 830 alternating between the non-transparent regions 810. Note that the ratio between the alternating phase shift pattern 888 and the device pattern region 802 is greatly exaggerated for clearer explanations.

Similar to the description on FIG. 6, a sufficient overall width L' in the alternating phase shift patterns 888 must be provided before phase errors of the alternating phase shift mask 800 can be deduced accurately from the overlay errors on the photoresist patterns. In general, the monitor photoresist pattern has a corresponding width of at least about 5–10 μm.

As shown in FIG. 8B, the modification mask 900 includes a nontransparent region 902 for protecting device (enclosed by a dashed-line square) and modification patterns 988 that correspond to the alternating phase shift patterns 888. The non-transparent regions 810 of the aforementioned alternating phase shift patterns 888 correspond to the longitudinal regions enclosed by dashed lines in FIG. 8B. Each modification marks 988 comprises a plurality of non-transparent regions 910. The nontransparent regions 902 and 910 are formed by coating a layer of chromium over the mask. In each modification pattern 988, the non-transparent regions 910 correspond in position to the same side of a pair of non-transparent regions 810 on each side of a phase shift region 830 inside an alternating phase shift pattern 888. Furthermore, width of the nontransparent region 910 is greater than the non-transparent region 810 so that photoresist patterns on the same side of each pair of photoresist patterns corresponding to the sides of every phase shift region 830 are covered.

In conclusion, the embodiments of this invention utilize an alternating phase shift mask/alternating phase shift pattern to produce a plurality of pairs of photoresist patterns. Subsequently, a modification mask/modification pattern is used to remove photoresist patterns on the same side of every pair of photoresist pattern while retaining the photoresist pattern on the other side. Because all the retained photoresist patterns are shifted an identical distance in the same direction, overall amount of shifting in the photoresist patterns (the amount of shifting of the monitor photoresist pattern obtained from the phase error monitor pattern) is non-zero. Hence, an overlay error analyzer can easily measure and be used to deduce the phase errors in the alternating phase shift mask.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase error monitor pattern for monitoring phase errors in an alternating phase shift mask, wherein the phase error monitor pattern comprises an alternating phase shift pattern and a modification pattern, such that:

the alternating phase shift patterns are located at peripheries of the alternating phase shift mask, the modification patterns are located at peripheries of a modification mask, the alternating phase shift mask and the modification mask are used in sequence in a same photo-exposure operation, and positions of the alternating phase shift patterns and positions of the modification patterns correspond to each other;

the alternating phase shift pattern further includes a plurality of first non-transparent regions as well as a plurality of phase shift regions and a plurality of transparent regions alternating between the non-transparent regions, wherein every pair of first non-transparent regions corresponding to sides of each phase shift region forms a pair; and the modification pattern further includes a plurality of second non-transparent regions, wherein each second non-transparent region corresponds in position to a region in a first side of a pair of first non-transparent regions, and a width of each second non-transparent region is greater than a width of any one of the first non-transparent regions.

2. The phase error monitor pattern of claim 1, wherein a plurality of the alternating phase shift pattern/modification patterns are formed on four sides of the alternating phase shift mask/modification mask.

3. The phase error monitor pattern of claim 1, wherein a process of forming the phase error monitor pattern is capable of forming a monitor photoresist pattern on a positive photoresist layer such that a width of the photoresist pattern at a perpendicular direction to the first non-transparent regions is about 5 μm to 10 μm.

4. The phase error monitor pattern of claim 1, wherein the first/the second non-transparent regions are formed by depositing chromium.

5. A method of monitoring the phase errors of an alternating phase shift mask using a phase error monitor pattern, wherein:

the phase error monitor pattern includes an alternating phase shift pattern and a modification pattern, wherein the alternating phase shift pattern/modification pattern is located at peripheries of the alternating phase shift mask/modification mask, and the alternating phase shift patterns and the modification patterns correspond to each other;

the alternating phase shift pattern further includes a plurality of first non-transparent regions as well as a plurality of phase shift regions and a plurality of transparent regions alternating between the non-transparent regions, wherein every pair of first non-transparent regions corresponding to sides of each phase shift region forms a pair; and the modification pattern further includes a plurality of second non-transparent regions, wherein each second non-transparent region corresponds in position to a region in the first side of a pair of first non-transparent regions, and a width of each second non-transparent region is greater than a width of any one of the first non-transparent regions, wherein the method of monitoring includes:

(a) performing a photo-exposure by shining a beam of light through the alternating phase shift mask at a positive photoresist layer to form an unmodified photoresist pattern in the photoresist layer, wherein the plurality of photoresist patterns correspond in location to the first non-transparent regions, and every pair of photoresist patterns corresponding to the sides of a phase shift region form a pair;

(b) performing another photo-exposure by shining a beam of light through the modification mask at the positive photoresist layer to retain the photoresist pattern on a first side of each pair of photoresist pattern but remove the photoresist pattern on a second side of each pair of photoresist pattern, thereby forming a monitor photoresist pattern;

(c) measuring an amount of deviation in the monitor photoresist pattern using an overlay error analyzer; and (d) deducing a phase error of the alternating phase shift mask from a defocusing value of the exposing light source and a measured deviation of the monitor photoresist pattern.

6. The method of claim 5, wherein deducing the phase error of the alternating phase shift mask further includes:
   changing the defocusing value of the exposure light source and repeating (a) to (c) to obtain a series of deviations of the monitor photoresist pattern;
   plotting the deviations and the defocusing value of the exposure light source to produce a curve; and
   deducing the phase error of the alternating phase shift mask by measuring a slope of the curve.

7. The method of claim 5, wherein a width of the monitor photoresist pattern at a perpendicular direction to the first non-transparent patterns regions is about 5 µm to 10 µm.

8. The method of claim 5, wherein the first/the second non-transparent regions are formed by depositing chromium.

9. A method of monitoring a phase error of an alternating phase shift mask, wherein the alternating phase shift mask includes a plurality of first non-transparent regions as well as a plurality of phase shift regions and a plurality of transparent regions alternating between the non-transparent regions, the method comprising:
   (a) performing a photo-exposure by shining a beam of light through the alternating phase shift mask at a positive photoresist layer to form an unmodified photoresist pattern in the photoresist layer, wherein the plurality of photoresist patterns correspond in location to the first non-transparent regions, and every pair of photoresist patterns corresponding to sides of a phase shift region form a pair;
   (b) performing another photo-exposure by shining a beam of light through the modification mask at the positive photoresist layer to retain the photoresist pattern on a first side of each pair of photoresist pattern but remove the photoresist pattern on a second side of each pair of photoresist pattern, thereby forming a monitor photoresist pattern;
   (c) measuring an amount of deviation in the monitor photoresist pattern using an overlay error analyzer; and
   (d) deducing a phase error of the alternating phase shift mask from a defocusing value of the exposing light source and the measured deviation of the monitor photoresist pattern.

10. The method of claim 9, wherein the step of deducing the phase error of the alternating phase shift mask further includes:
   changing the defocusing value of the exposure light source and repeating (a) to (c) to obtain a series of deviations of the monitor photoresist pattern;
   plotting the deviations and the defocusing value of the exposure light source to produce a curve; and
   deducing a phase error of the alternating phase shift mask by measuring a slope of the curve.

11. The method of claim 9, wherein width of the monitor photoresist pattern at a perpendicular direction to the first non-transparent regions is about 5 µm to 10 µm.

12. The method of claim 9, wherein the modification mask includes a plurality of second non-transparent regions for covering the photoresist pattern on the first side of every pair of photoresist pattern, and the second non-transparent regions are chromium-coated layers.

13. A method of monitoring the deviation of photoresist patterns produced by an alternating phase shift photomask, wherein the alternating phase shift mask includes a plurality of first non-transparent regions as well as a plurality of phase shift regions and a plurality of transparent regions alternating between the non-transparent region, the plurality of photoresist patterns correspond in position to the first non-transparent regions, and every pair of photoresist patterns that corresponds to sides of a phase shift region forms a pair, the method comprising:
   performing a photo-exposure using a modification mask so that the photoresist pattern on a first side of each pair of photoresist patterns is retained while the photoresist pattern on a second side of each pair of photoresist patterns is removed; and
   measuring an amount of shifting in retained photoresist patterns using an overlay error analyzer.

14. The monitoring method of claim 13, wherein the modification mask includes a plurality of second non-transparent regions for covering the photoresist pattern on the first side of every pair of photoresist pattern, and the second non-transparent regions are chromium-coated layers.

* * * * *